United States Patent
Yamamoto

(10) Patent No.: US 6,699,729 B1
(45) Date of Patent: Mar. 2, 2004

(54) METHOD OF FORMING PLANAR COLOR FILTERS IN AN IMAGE SENSOR

(75) Inventor: Katsumi Yamamoto, Shanghai (CN)

(73) Assignee: OmniVision International Holding Ltd, Grand Cayman (KY)

(*) Notice: Subject to any disclaimer, the term of this patent is extended or adjusted under 35 U.S.C. 154(b) by 0 days.

(21) Appl. No.: 10/280,490

(22) Filed: Oct. 25, 2002

(51) Int. Cl.⁷ ................................................ H01L 21/00
(52) U.S. Cl. ...................... 438/70; 438/69; 438/71; 438/73; 438/75; 438/65; 438/82; 438/780; 438/782; 257/435; 257/232; 257/233; 257/316; 257/324; 257/432; 257/440; 345/168; 428/432; 349/116
(58) Field of Search ................. 438/780, 782, 438/70, 73, 75, 69, 71, 82, 65; 257/435, 232, 233, 316, 324, 432, 440; 345/168; 428/432; 349/116

(56) References Cited

U.S. PATENT DOCUMENTS

| | | | |
|---|---|---|---|
| 4,786,819 A | * 11/1988 | Tei | ................................. 430/7 |
| 6,040,056 A | * 3/2000 | Anzaki et al. | ............... 428/432 |
| 6,043,001 A | * 3/2000 | Hirsh et al. | ................. 430/321 |
| 6,081,018 A | * 6/2000 | Nakashiba et al. | ......... 257/435 |
| 6,261,861 B1 | 7/2001 | Pai et al. | |
| 6,274,917 B1 | 8/2001 | Fan et al. | |
| 6,297,071 B1 | 10/2001 | Wake | |
| 6,362,513 B2 | 3/2002 | Wester | |
| 6,436,851 B1 | 8/2002 | Young et al. | |
| 6,496,240 B1 | * 12/2002 | Zhang et al. | ................ 349/116 |
| 6,531,266 B1 | * 3/2003 | Chang et al. | ................ 430/321 |
| 2002/0003201 A1 | * 1/2002 | Yu | ........................... 250/208.1 |
| 2003/0048256 A1 | * 3/2003 | Salmon | ....................... 345/168 |

* cited by examiner

*Primary Examiner*—Matthew Smith
*Assistant Examiner*—V. Yevsikov
(74) *Attorney, Agent, or Firm*—Perkins Coie LLP

(57) ABSTRACT

A method of planarizing an image sensor substrate is disclosed. The method comprises depositing a first polymer layer over the image sensor substrate. The first polymer layer is patterned to form pillars. Then, a second polymer layer is deposited over the pillars. Optionally, the second polymer layer is etched back.

6 Claims, 3 Drawing Sheets

METHOD OF FORMING PLANAR COLOR FILTERS IN AN IMAGE SENSOR

TECHNICAL FIELD

The present invention relates to image sensors, and more particularly, towards the color filters applied to an image sensor.

BACKGROUND

Image sensors are electronic integrated circuits that can be used to produce still or video images. Solid state image sensors can be either of the charge: coupled device (CCD) type or the complimentary metal oxide semiconductor (CMOS) type. In either type of image sensor, a light gathering pixel is formed in a substrate and arranged in a two-dimensional array. Modern image sensors typically contain millions of pixels to provide a high resolution image. An important part of the image sensor are the color filters and micro-lens structures formed atop of the pixels. The color filters, as the name implies, are operative, in conjunction with signal processing, to provide a color image. The micro-lenses serve to focus the incident light onto the pixels, and thus to improve the fill factor of each pixel.

While the technology underlying the formation of color filters is relatively mature, there are still issues that may arise, particularly at higher integration densities. For example, U.S. Pat. No. 6,297,071, U.S. Pat. No. 6,362,513, and U.S. Pat. No. 6,271,900 show the current state of the color filter art. In most color filter processes, one important requirement is that the color filter layers be applied in a planar manner. This can be made easier if the underlying substrate upon which the color filter is applied is planar to begin with.

The underlying substrate, underneath the color filter layers, is relatively "lumpy", due to various reasons. In the prior art, this lumpiness would be simply resolved by first depositing a first planarizing layer using spin on techniques into the valleys of the substrate topography. Then, a second planarizing layer would be deposited over the first planarizing layer. Both planarizing layers are typically polymers, such as polymethylmethylacrylate (PMMA) or polyglycidylmethylacrylate (PGMA). Nevertheless, this approach still does not provide the desired amount of planarization.

DETAILED DESCRIPTION

The present invention relates to a method for forming a planarizing layer prior to formation of a color filter layer used in an image sensor. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
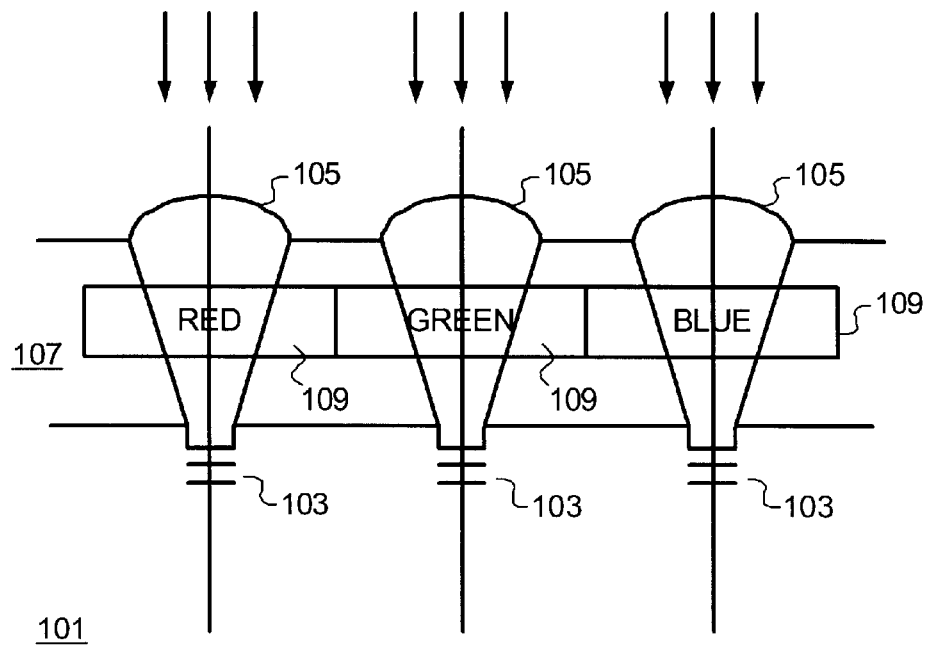
FIG. 1 is a prior art cross sectional view of a portion of an image sensor.

FIG. 1 shows a prior art cross-sectional simplified diagram of an image sensor 101 having micro-lenses formed thereon. As seen in FIG. 1, the image sensor includes a plurality of pixels that have light detecting elements 103 formed in the substrate. The light detecting elements 103 may be one of several types, such as a photodiode, a photogate, or other solid state light sensitive element. Formed atop of each pixel is a micro-lens 105. The micro-lens 105 focuses incident light onto the light detecting elements 103. Micro-lenses are often formed by spin coating a layer of micro-lens material onto a planarized layer. The micro-lens material is then etched to form cylindrical or other shaped regions that are centered above each pixel. Then, the micro-lens material is heated and reflowed to form a convex hemispherical micro-lens. Moreover, in the region between the light detecting elements 103 and the micro-lens 105, denoted by reference numeral 107, there are various intervening layers that would typically include the color filter layers 109 and various metal conducting lines. It can be appreciated that the structure of FIG. 1 is merely one example of an image sensor structure and that the present invention is adaptable to any number of variants. Alternatively, the color filters 109 may be formed atop of the micro-lenses 105.

The color filters 109 are typically a pigmented or dyed material that will only allow a narrow band of light to pass therethrough, for example, red, blue, or green. In other embodiments, the color filter may be cyan, yellow, or magenta. These are but example colors for the color filters 109. While the use of pigmented or dyed color materials is the most prevalent form of color filters, other reflective type color filters may be used, such as a multilayer stack reflective material. The formation of color filters 109 is known in art and will not be described herein to avoid any unnecessary obscuration with the description of the present invention.

Figure 2:
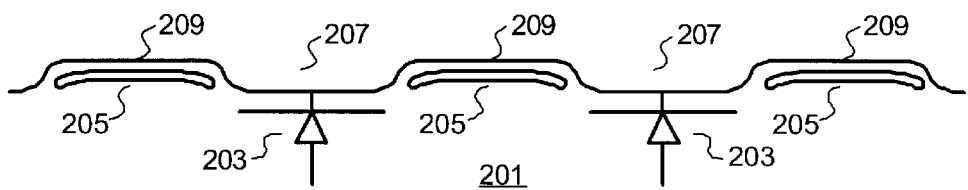
FIGS. 2–5 are schematic cross-sections illustrating the method of one embodiment of the present invention.

The present invention is directed towards the process of preparing (by planarizing) the substrate prior to forming the color filters 109. FIG. 2 shows a typical wafer substrate 201 that has pixels formed therein. The pixels include light detecting elements 203, which in this case are photodiodes. However, it can be appreciated that other types of light detecting elements, now known (such as a photogate) or developed in the future, may be used. Further, the pixels will typically also include amplification and/or readout circuitry. For clarity, this circuitry is not shown in FIG. 2. In one embodiment, the pixels may be active pixels, commonly known in the prior art. Details of forming the photodiode and other associated circuitry are known in the prior art and will not be repeated herein to avoid obscuring the present invention. However, examples of the prior art may be seen in U.S. Pat. No. 5,904,493 and U.S. Pat. No. 6,320,617.

Moreover, other structures are present in the substrate 201. One example are conductive structures 205 are polysilicon or metallic interconnects, such as those used to carry signals to or from the light detecting elements 203 or to or from other components in the pixels. Because these conductive structures 205 are usually formed atop of the substrate 201, this causes an uneven topography characterized by valleys 207 and ridges 209.

Figure 3:
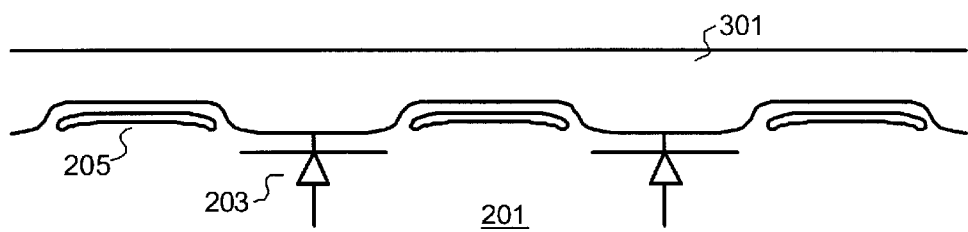

It is the valleys 207 and ridges 209 that should be planarized prior to the formation of the color filters 109. Thus, turning to FIG. 3, according to one embodiment of the present invention, a first polymer layer 301 is spin coated over the substrate 301. The first polymer layer 301 in one embodiment is polyglycidylmethylacrylate (PGMA) or polymethylmethylacrylate (PMMA). However, other types of materials may be substituted, but preferably materials that may be spun on and subsequently cured into a solid. Examples include various spin on glass materials and photoresist materials.

Figure 4:
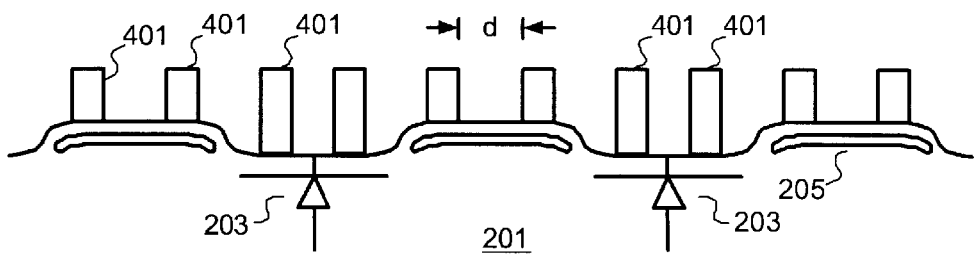

As will be seen below with respect to FIG. 4, the photoresist-type materials are advantageous in one embodiment since they can be directly patterned by exposure and development. Non-photoresist type materials, while still capable, would require a further etching step. Specifically, as seen in FIG. 4, the first polymer layer 301 is patterned into pillars 401 having a separation distance of d. The pillars 401 need not be set in a regular pattern, nor have any particular dimensions, but in one embodiment, the parameter d is on the order of 2 microns. In the case of a photoresist-type material, the patterning of the first polymer layer 301 into the pillars 401 may be accomplished by exposing the first polymer layer 301 to an exposing radiation from, for example, a stepper machine. Then, the first polymer layer 301 can be developed to form the pillars 401. In the case of a non-photoresist type material, the patterning of the first polymer layer 301 may require the use of various masking and-etching techniques.

Figure 5:
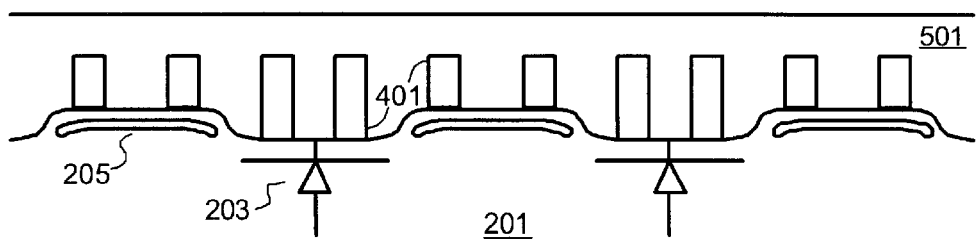

Turning to FIG. 5, after the pillars 401 have been formed, a second polymer layer 501 is applied over the pillars 401. The second polymer layer 501 in one embodiment is polymethylmethylacrylate (PMMA) or polyglybidylmethylacrylate (PGMA). However, other types of materials may be substituted, but preferably materials that may be spun on and subsequently cured into a solid. Examples include various spin on glass materials and photoresist materials. It has been found that the pillars 401 appear to cause the second polymer layer 501 to become substantially planar.

Further, to control the thickness of the planarizing second polymer layer 501, an optional etching back step may be performed to reduce the total thickness of the first and second polymer layers to a desired and/or controlled thickness above the substrate 201.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of planarizing an image sensor substrate comprising:

depositing a first polymer layer over said image sensor substrate;

patterning said first polymer layer to form pillars of said first polymer layer;

depositing a second polymer layer over said pillars of said first polymer layer; and etching back said second polymer layer.

2. A method of planarizing an image sensor substrate comprising:

depositing a first polymer layer over said image sensor substrate;

patterning said first polymer layer to form pillars of said first polymer layer; and depositing a second polymer layer over said pillars of said first polymer layer, wherein said pillars of said first polymer layer have a spacing of about 2 microns.

3. A method of planarizing an image sensor substrate comprising:

depositing a first polymer layer over said image sensor substrate;

patterning said first polymer layer to form pillars of said first polymer layer; and depositing a second polymer layer over said pillars of said first polymer layer, wherein said first polymer layer and said second polymer layer are polyglycidylmethylacrylate (PGMA) or polymethylmethylacrylate (PMMA).

4. A method of forming color filters over an image sensor substrate comprising:

depositing a first polymer layer over said image sensor substrate;

patterning said first polymer layer to form pillars of said first polymer layer;

depositing a second polymer layer over said pillars of said first polymer layer;

etching back said second polymer layer; and forming a color filter layer over said second polymer layer.

5. A method of forming color filters over an image sensor substrate comprising:

depositing a first polymer layer over said image sensor substrate;

patterning said first polymer layer to form pillars of said first polymer layer;

depositing a second polymer layer over said pillars of said first polymer layer;

forming a color filter layer over said second polymer layer; and wherein said pillars of said first polymer layer have a spacing of about 2 microns.

6. A method of forming color filters over an image sensor substrate comprising:

depositing a first polymer layer over said image sensor substrate;

patterning said first polymer layer to form pillars of said first polymer layer;

depositing a second polymer layer over said pillars of said first polymer layer; and forming a color filter layer over said second polymer layer, wherein said first polymer layer and said second polymer layer are polyglycidylmethylacrylate (PGMA) or polymethylmethylacrylate (PMMA).

* * * * *